United States Patent
Pakriswamy et al.

(10) Patent No.: US 6,831,799 B2
(45) Date of Patent: Dec. 14, 2004

(54) HIGH BANDWIDTH LOW NOISE CROSS-COUPLED AMPLIFIER

(75) Inventors: Elango Pakriswamy, Longmont, CO (US); Jong K. Kim, Longmont, CO (US); Michael P. Straub, Longmont, CO (US)

(73) Assignee: Agere Systems Inc., Allentown, PA (US)

( * ) Notice: Subject to any disclaimer, the term of this patent is extended or adjusted under 35 U.S.C. 154(b) by 370 days.

(21) Appl. No.: 09/725,356

(22) Filed: Nov. 29, 2000

(65) Prior Publication Data

US 2002/0093752 A1 Jul. 18, 2002

(51) Int. Cl.⁷ .............................. G11B 5/02; G11B 5/09
(52) U.S. Cl. ........................................ 360/67; 360/46
(58) Field of Search ................................ 360/67–68, 46

(56) References Cited

U.S. PATENT DOCUMENTS 5,559,646 A * 9/1996 Voorman et al. .............. 360/57
5,793,551 A * 8/1998 Ngo et al. ..................... 360/67
5,909,024 A * 6/1999 Voorman et al. ............. 235/449

* cited by examiner

Primary Examiner—Sinh Tran
Assistant Examiner—Varsha A. Kapadia

(57) ABSTRACT

A differential amplifier circuit for amplifying an input signal and for providing an output signal representative of the input signal includes first and second amplifier circuits, and first and second coupling circuits. The first and second amplifier circuits each include first and second transistors, a resistor, and a current generator. The first coupling circuit includes a transistor, a capacitor, and a current generator, and couples a first input signal node to the first transistor of the second amplifier circuit. The second coupling circuit includes a transistor, a capacitor, and a current generator, and couples a second input signal node to the first transistor of the first amplifier circuit.

16 Claims, 6 Drawing Sheets

EQUIVALENT INPUT CIRCUIT

CC1 >> Cpi1 & CC1 >> Cpi2
CC2 >> Cpi1 & CC2 >> Cpi2
CC1 >> Cpi5 & CC1 >> Cpi6
CC2 >> Cpi5 & CC2 >> Cpi6

$R_{eff} = R_e \parallel R_{pi1} \simeq R_e$
$C_{eff} = (3 \cdot C_{pi1})/2$

SIMPLIFIED CIRCUIT

EQUIVALENT INPUT CIRCUIT

CC1 >> Cpi1 & CC1 >> Cpi2
CC2 >> Cpi1 & CC2 >> Cpi2

SIMPLIFIED CIRCUIT

HIGH BANDWIDTH LOW NOISE CROSS-COUPLED AMPLIFIER

BACKGROUND OF THE INVENTION

The present invention relates to a read system for reading information from a magnetic storage medium using a magnetoresistive head and for providing an output signal representative of the information read. In particular, the present invention relates to a read system with improved bandwidth and high frequency noise performance.

A popular method of magnetic data storage utilizes magnetoresistive (MR) heads to store and recover data on a magnetic data storage medium such as a magnetic disk. An MR head employs an MR element that changes in resistivity with changing magnetic flux from data patterns on an adjacent magnetic disk surface. A bias current having a constant value is passed through the MR element, and the change in resistivity is measured by sensing the change in voltage across the MR head.

Amplifier circuits that sense signals from MR heads commonly include differential inputs and differential outputs. While there are a wide variety of differential amplifier circuit topologies, most include an input stage with two load resistors and symmetrical transistors for splitting current between the load resistors. Usually, the output voltage is taken as the difference in the voltage drops across the load resistors; in this manner, large variations in output voltages may be achieved with extremely small input voltage differentials.

For all differential amplifier circuits there are associated therewith certain frequency response performance characteristics. These characteristics and others determine the usefulness of the amplifier circuit in any given application. The band of frequencies over which the gain of the amplifier circuit is almost constant is called the bandwidth. Signals whose frequencies are outside the bandwidth will experience lower gain, with the gain decreasing as the signals move farther away from the bandwidth. Normally, the amplifier circuit is designed so that its bandwidth coincides with the spectrum of signals it is required to amplify. If this were not the case, the amplifier circuit would distort the frequency spectrum of the input signal, with different components of the input signal being amplified by different amounts.

One well-known modification to the differential amplifier circuit is the addition of two capacitors that are cross-coupled to the transistors of the input stage. The capacitive (or ac) cross-coupling causes the noise resistances of the input transistors to be connected in parallel instead of in series, thereby reducing the effective noise resistances of the input transistors. An example of such a circuit is shown in U.S. Pat. No. 5,559,646. However, the main disadvantage of this type of circuit is its limited bandwidth. Because the cross-coupled capacitors cause the input capacitances of the input transistors to be connected in parallel, the effective input capacitances of the input transistors are increased. Therefore, because upper cutoff frequency is inversely proportional to input capacitance for transistors, the high frequency bandwidth of the circuit is reduced and the high frequency noise is increased.

Accordingly, there is a need for a differential amplifier circuit having a cross-coupled input stage with improved bandwidth and high frequency noise performance.

BRIEF SUMMARY OF THE INVENTION

The present invention is a differential amplifier circuit for amplifying an input signal and for providing an output signal representative of the input signal. First and second amplifier circuits each include first and second transistors, a resistor, and a current generator. A first coupling circuit includes a transistor, a capacitor, and a current generator, and couples a first input signal node to the first transistor of the second amplifier circuit. A second coupling circuit includes a transistor, a capacitor, and a current generator, and couples a second input signal node to the first transistor of the first amplifier circuit.

DETAILED DESCRIPTION

Figure 1:
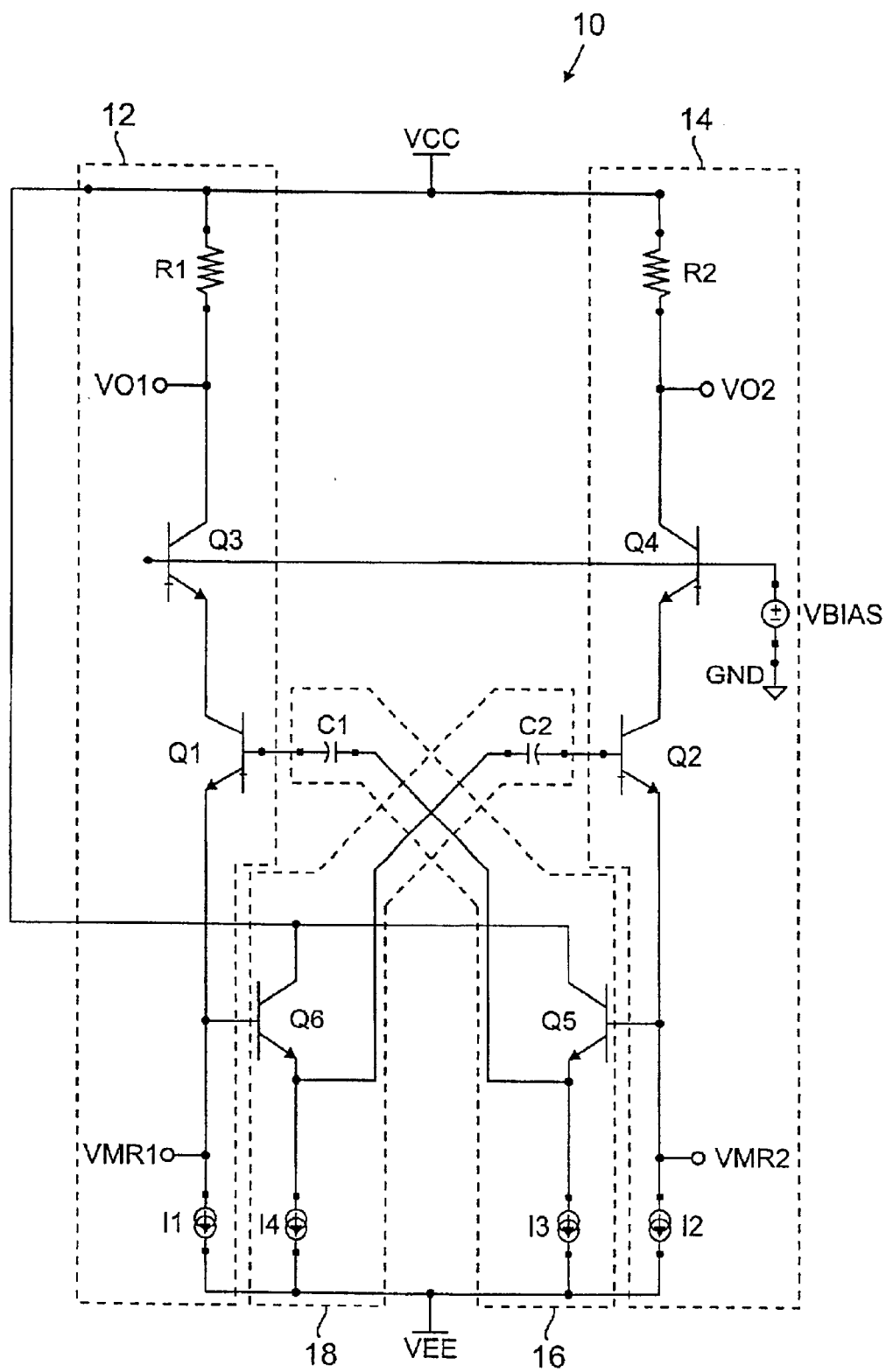
FIG. 1 shows a circuit schematic diagram of a read system embodying the present invention.

FIG. 1 shows a circuit schematic diagram of a read system 10 embodying the present invention. Read system 10 includes parallel amplifier circuits 12 and 14, coupling circuits 16 and 18, input signal nodes VMR1 and VMR2, output signal nodes VO1 and VO2, bias voltage VBIAS, and voltage potentials VCC and VEE.

Parallel amplifier circuit 12 includes transistors Q1 and Q3, resistor R1, and current generator I1. Transistors Q1 and Q3 are npn bipolar junction transistors each having a base, a collector, and an emitter. The emitter of transistor Q1 is connected to input signal node VMR1, and the collector of transistor Q1 is connected to the emitter of transistor Q3. The base of transistor Q3 is connected to bias voltage VBIAS, and the collector of transistor Q3 is connected to voltage potential VCC through resistor R1. Current generator I1 is connected between the emitter of transistor Q1 and voltage potential VEE. Output signal node VO1 is connected to the collector of transistor Q3.

Parallel amplifier circuit 14 includes transistors Q2 and Q4, resistor R2, and current generator I2. Transistors Q2 and Q4 are npn bipolar junction transistors each having a base, a collector, and an emitter. The emitter of transistor Q2 is connected to input signal node VMR2, and the collector of transistor Q2 is connected to the emitter of transistor Q4. The base of transistor Q4 is connected to bias voltage VBIAS, and the collector of transistor Q4 is connected to voltage potential VCC through resistor R2. Current generator I2 is connected between the emitter of transistor Q2 and voltage potential VEE. Output signal node VO2 is connected to the collector of transistor Q4.

Coupling circuit 16 includes transistor Q5, capacitor C1, and current generator I3. Transistor Q5 is a npn bipolar junction transistor having a base, a collector, and an emitter.

The base of transistor Q5 is connected to input signal node VMR2, the collector of transistor Q5 is connected to voltage potential VCC, and the emitter of transistor Q5 is coupled to the base of transistor Q1 through capacitor C1. Current generator I3 is connected between the emitter of transistor Q5 and voltage potential VEE.

Coupling circuit 18 includes transistor Q6, capacitor C2, and current generator I4. Transistor Q6 is a npn bipolar junction transistor having a base, a collector, and an emitter. The base of transistor Q6 is connected to input signal node VMR1, the collector of transistor Q6 is connected to voltage potential VCC, and the emitter of transistor Q6 is coupled to the base of transistor Q2 through capacitor C2. Current generator I4 is connected between the emitter of transistor Q6 and voltage potential VEE.

In operation, the voltage across an MR head is related to the signal that is retrieved from a data pattern on an adjacent magnetic disk surface. This voltage across the MR head is represented in FIG. 1 at input signal nodes VMR1 and VMR2. The voltage difference between input signal nodes VMR1 and VMR2 is the input signal that is sensed by read system 10. Variations in the voltage difference between input signal nodes VMR1 and VMR2 lead to variations in the currents through parallel amplifier circuits 12 and 14, due to the constant values of resistors R1 and R2. These variations in currents lead to voltage variations across resistors R1 and R2, which in turn lead to variations in the voltage difference between output signal nodes VO1 and VO2.

Transistor Q3 and resistor R1 form a collector circuit, as do transistor Q4 and resistor R2. Transistors Q3 and Q4 form a differential common-base stage, otherwise known as a cascode stage. The load resistance seen by transistor Q1 is not resistor R1 but is the much lower input resistance of transistor Q3. Similarly, the load resistance seen by transistor Q2 is not resistor R2 but is the much lower input resistance of transistor Q4. Because load resistance is inversely proportional to upper cutoff frequency for bipolar junction transistors, these reductions in the effective load resistances of transistors Q1 and Q2 lead to a considerable improvement in the amplifier circuit frequency response.

Transistors Q5 and Q6 are the most important features of the present invention. By coupling input signal node VMR2 to the base of transistor Q1 using both transistor Q5 and capacitor C1, the input capacitance of transistor Q1 is reduced compared to using a capacitor alone. This is because transistor Q5 is connected as an emitter follower and provides an emitter-base capacitance that, when connected in series with capacitor C1, reduces the net capacitance between input signal node VMR2 and transistor Q1. Similarly, by coupling input signal node VMR1 to the base of transistor Q2 using both transistor Q6 and capacitor C2, the input capacitance of transistor Q2 is reduced compared to using a capacitor alone. This is because transistor Q6 is connected as an emitter follower and provides an emitter-base capacitance that, when connected in series with capacitor C2, reduces the net capacitance between input signal node VMR1 and transistor Q2. Because input capacitance is inversely proportional to upper cutoff frequency for bipolar junction transistors, these reductions in the effective input capacitances of transistors Q1 and Q2 lead to a higher upper cutoff frequency and thus a considerable increase in the bandwidth of the input stage, which in turn decreases high frequency noise.

When analyzing transistor circuits, small-signal equivalent circuit models are often used to express the components of the transistors in terms of model parameters. In this way, it is possible to understand the signal operation of the transistors, and reduce the circuit to an equivalent circuit model consisting of more basic circuit elements. Model parameters which are useful in analyzing the effects of coupling circuits 16 and 18 of read system 10 include both the base-emitter input resistances and the base-emitter capacitances of transistors Q1, Q2, Q5, and Q6. The small-signal input resistance between the base and the emitter of a bipolar junction transistor, looking into the base, is denoted by Rpi. The emitter-base capacitance of a bipolar junction transistor is denoted by Cpi.

Figure 2A:
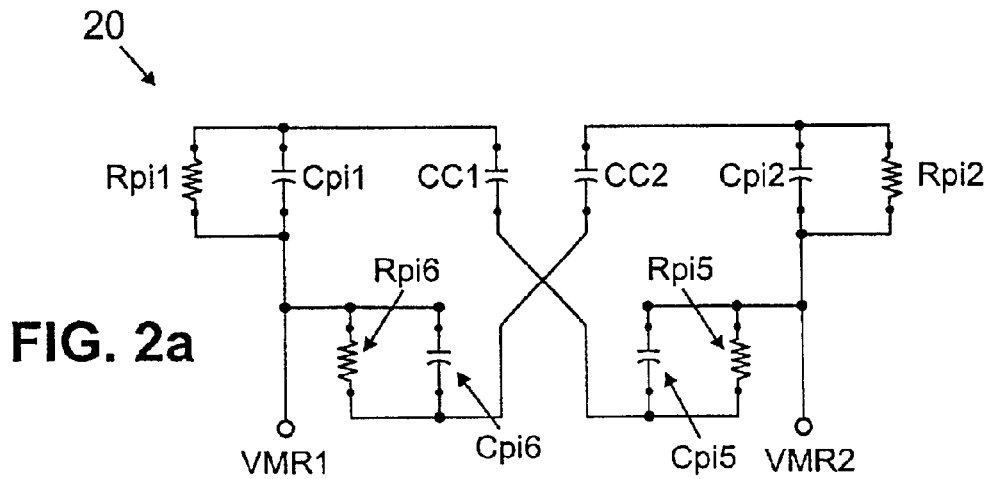
FIG. 2a shows an equivalent input circuit schematic diagram of a read system embodying the present invention.

FIG. 2a shows an equivalent input circuit schematic diagram of read system 10. Equivalent input circuit 20 includes input signal nodes VMR1 and VMR2, capacitors CC1, CC2, Cpi1, Cpi2, Cpi5, and Cpi6, and resistors Rpi1, Rpi2, Rpi5, and Rpi6. Capacitor Cpi1 and resistor Rpi1 (parameters representing transistor Q1) are connected in parallel between input signal node VMR1 and capacitor CC1 (parameter representing capacitor C1). Capacitor Cpi6 and resistor Rpi6 (parameters representing transistor Q6) are connected in parallel between input signal node VMR1 and capacitor CC2 (parameter representing capacitor C2). Capacitor Cpi2 and resistor Rpi2 (parameters representing transistor Q2) are connected in parallel between input signal node VMR2 and capacitor CC2. Capacitor Cpi5 and resistor Rpi5 (parameters representing transistor Q5) are connected in parallel between input signal node VMR2 and capacitor CC1. The value of capacitors CC1 and CC2 each greatly exceed the value of capacitors Cpi1, Cpi2, Cpi5, and Cpi6.

Figure 2B:
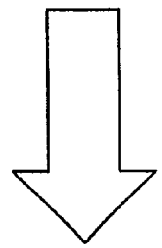
FIG. 2b shows a simplified input circuit schematic diagram of a read system embodying the present invention.
Figure 2B:
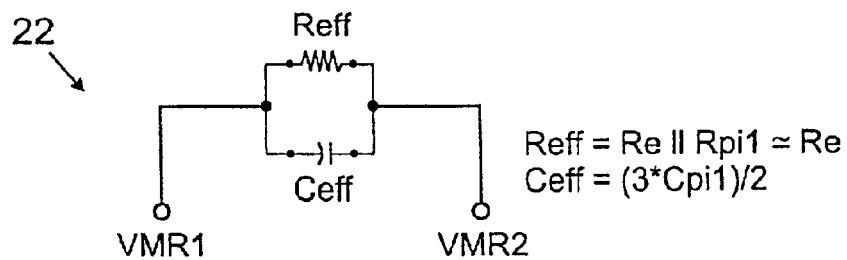

FIG. 2b shows a simplified input circuit schematic diagram of read system 10. Simplified input circuit 22 is a reduced form of equivalent input circuit 20. Capacitors CC1, CC2, Cpi1, Cpi2, Cpi5, and Cpi6 of equivalent input circuit 20 can all be reduced to a single effective capacitance Ceff. This is because capacitors connected in series can be replaced by a single equivalent capacitor, which is related to the individual capacitors by the formula $$\frac{1}{C_{eq}} = \frac{1}{C_1} + \frac{1}{C_2} + \ldots + \frac{1}{C_n}$$

And capacitors connected in parallel can be replaced by a single equivalent capacitor which is equal to the sum of the individual capacitors. Similarly, resistors Rpi1, Rpi2, Rpi5, and Rpi6 of equivalent input circuit 20 can all be reduced to a single effective resistance Reff. This is because resistors connected in series can be replaced by a single equivalent resistor which is equal to the sum of the individual resistors. And resistors connected in parallel can be replaced by a single equivalent resistor, which is related to the individual resistors by the formula $$\frac{1}{R_{eq}} = \frac{1}{R_1} + \frac{1}{R_2} + \ldots + \frac{1}{R_n}$$

Simplified input circuit 22 includes input signal nodes VMR1 and VMR2, capacitor Ceff, and resistor Reff. Capacitor Ceff and resistor Reff are connected in parallel between input signal nodes VMR1 and VMR2. The value of capacitor Ceff is equal to 3(Cpi1)/2, where capacitor Cpi1 is from equivalent input circuit 20. The value of resistor Reff is equal to the value of Re in parallel with the value of Rpi1, which is approximately Re (the value of Rpi1 greatly exceeds the value of Re), where resistor Re is the small-signal base-emitter input resistance of transistor Q1 looking into the emitter, and resistor Rpi1 is from equivalent input circuit 20.

Figure 3:
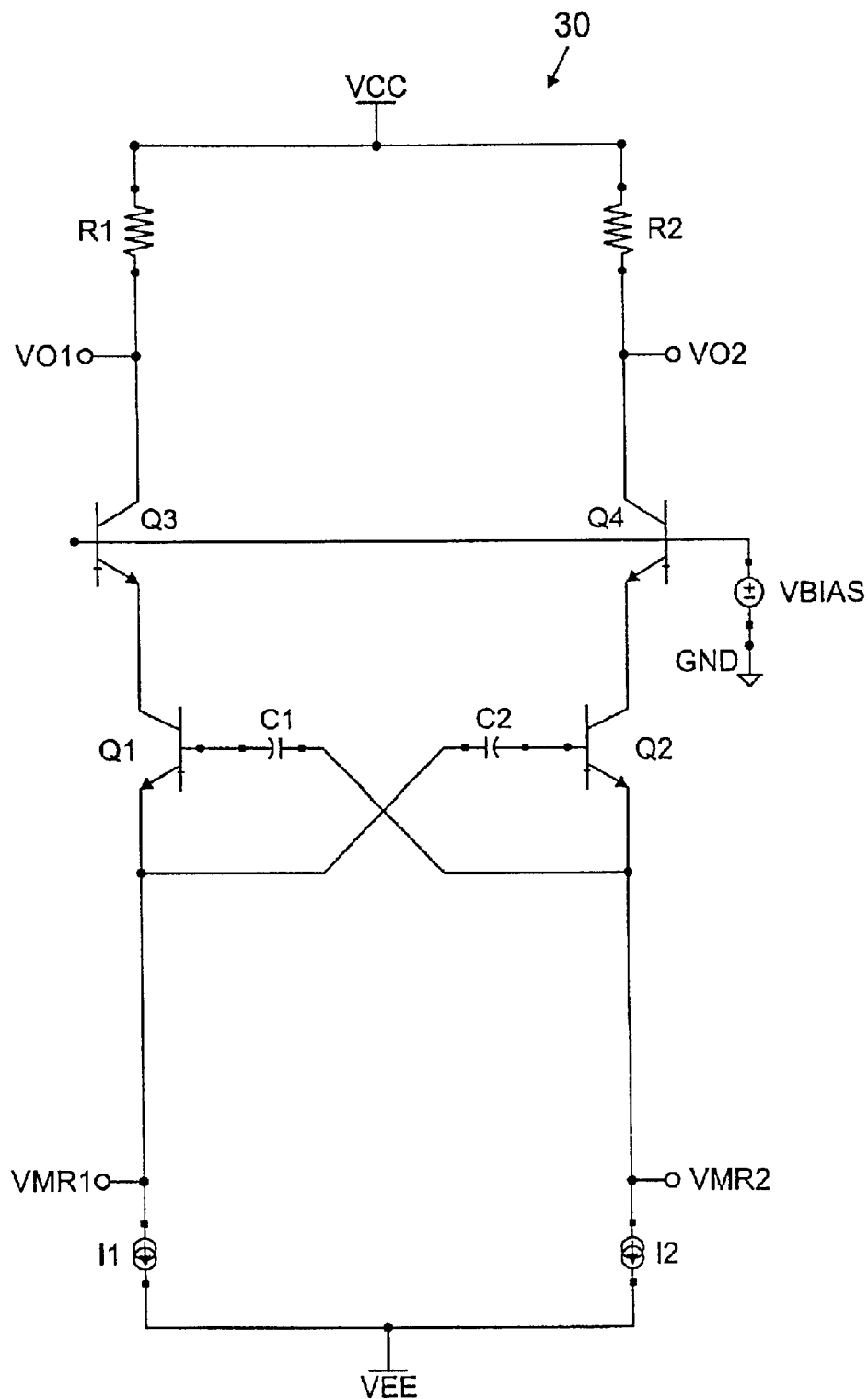
FIG. 3 shows a circuit schematic diagram of a prior art read system.

In order to appreciate the improvements of the present invention, the input capacitance, bandwidth, and noise of read system 10 are compared to the same characteristics of a prior art read system shown in FIG. 3.

FIG. 3 shows a circuit schematic diagram of a prior art read system 30. Prior art read system 30 is similar to read system 10 with the exception that transistors Q5 and Q6, and current generators I3 and I4 are not present. Instead, capacitor C1 is directly connected between input signal node VMR2 and the base of transistor Q1, and capacitor C2 is directly connected between input signal node VMR1 and the base of transistor Q2. Due to the lack of additional emitter-base capacitances between the input signal nodes and the input transistors, prior art read system 30 lacks the reduced input capacitance caused by the emitter-base capacitances of transistors Q5 and Q6 in read system 10. Because input capacitance is inversely proportional to upper cutoff frequency for bipolar junction transistors, prior art read system 30 possesses a more limited high frequency bandwidth than read system 10, and therefore exhibits greater high frequency noise than read system 10.

Figure 4A:
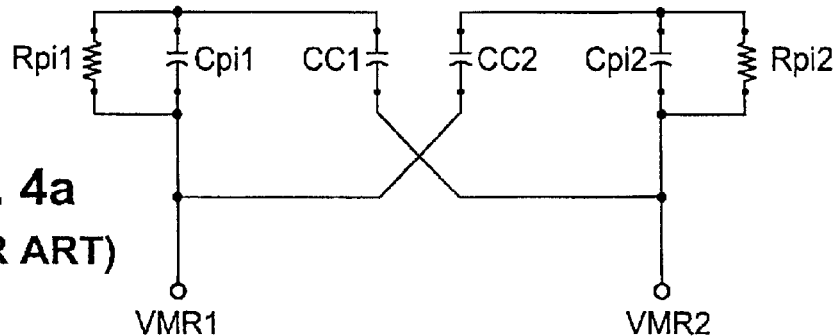
FIG. 4a shows an equivalent input circuit schematic diagram of a prior art read system.

FIG. 4a shows an equivalent input circuit schematic diagram of prior art read system 30. Equivalent input circuit 40 includes input signal nodes VMR1 and VMR2, capacitors CC1, CC2, Cpi1, and Cpi2, and resistors Rpi1 and Rpi2. Capacitor Cpi1 and resistor Rpi1 (parameters representing transistor Q1) are connected in parallel between input signal node VMR1 and capacitor CC1 (parameter representing capacitor C1), and capacitor CC1 is connected to input signal node VMR2. Capacitor Cpi2 and resistor Rpi2 (parameters representing transistor Q2) are connected in parallel between input signal node VMR2 and capacitor CC2 (parameter representing capacitor C2), and capacitor CC2 is connected to input signal node VMR1. The value of capacitors CC1 and CC2 each greatly exceed the value of capacitors Cpi1 and Cpi2.

Figure 4B:
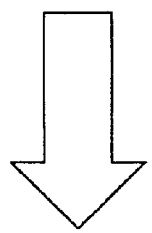
FIG. 4b shows a simplified input circuit schematic diagram of a prior art read system.
Figure 4B:
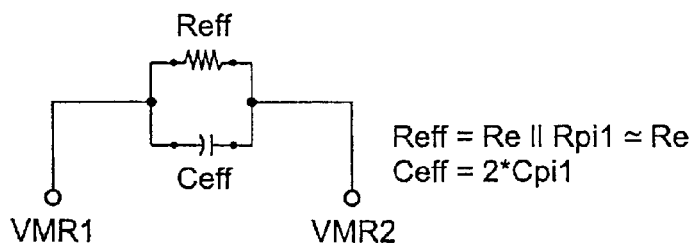

FIG. 4b shows a simplified input circuit schematic diagram of prior art read system 30. Simplified input circuit 42 is a reduced form of equivalent input circuit 40. For similar reasons discussed above, capacitors CC1, CC2, Cpi1, and Cpi2 of equivalent input circuit 40 can all be reduced to a single effective capacitance Ceff, and resistors Rpi1 and Rpi2 of equivalent input circuit 40 can be reduced to a single effective resistance Reff. Simplified input circuit 42 includes input signal nodes VMR1 and VMR2, capacitor Ceff, and resistor Reff. Capacitor Ceff and resistor Reff are connected in parallel between input signal nodes VMR1 and VMR2. The value of capacitor Ceff is equal to 2(Cpi1), where capacitor Cpi1 is from equivalent input circuit 40. The value of resistor Reff is equal to the value of Re in parallel with the value of Rpi1, which is approximately Re (the value of Rpi1 greatly exceeds the value of Re), where resistor Re is the small-signal base-emitter input resistance of transistor Q1 looking into the emitter, and resistor Rpi1 is from equivalent input circuit 40.

Comparing simplified input circuit 22 of the present invention to simplified input circuit 42 according to the prior art, it can be seen that the value of capacitor Ceff of simplified input circuit 42 is approximately 33% greater than the value of Ceff of simplified input circuit 22. Therefore, the input capacitance of prior art read system 30 is approximately 33% greater than the input capacitance of read system 10.

Figure 5:
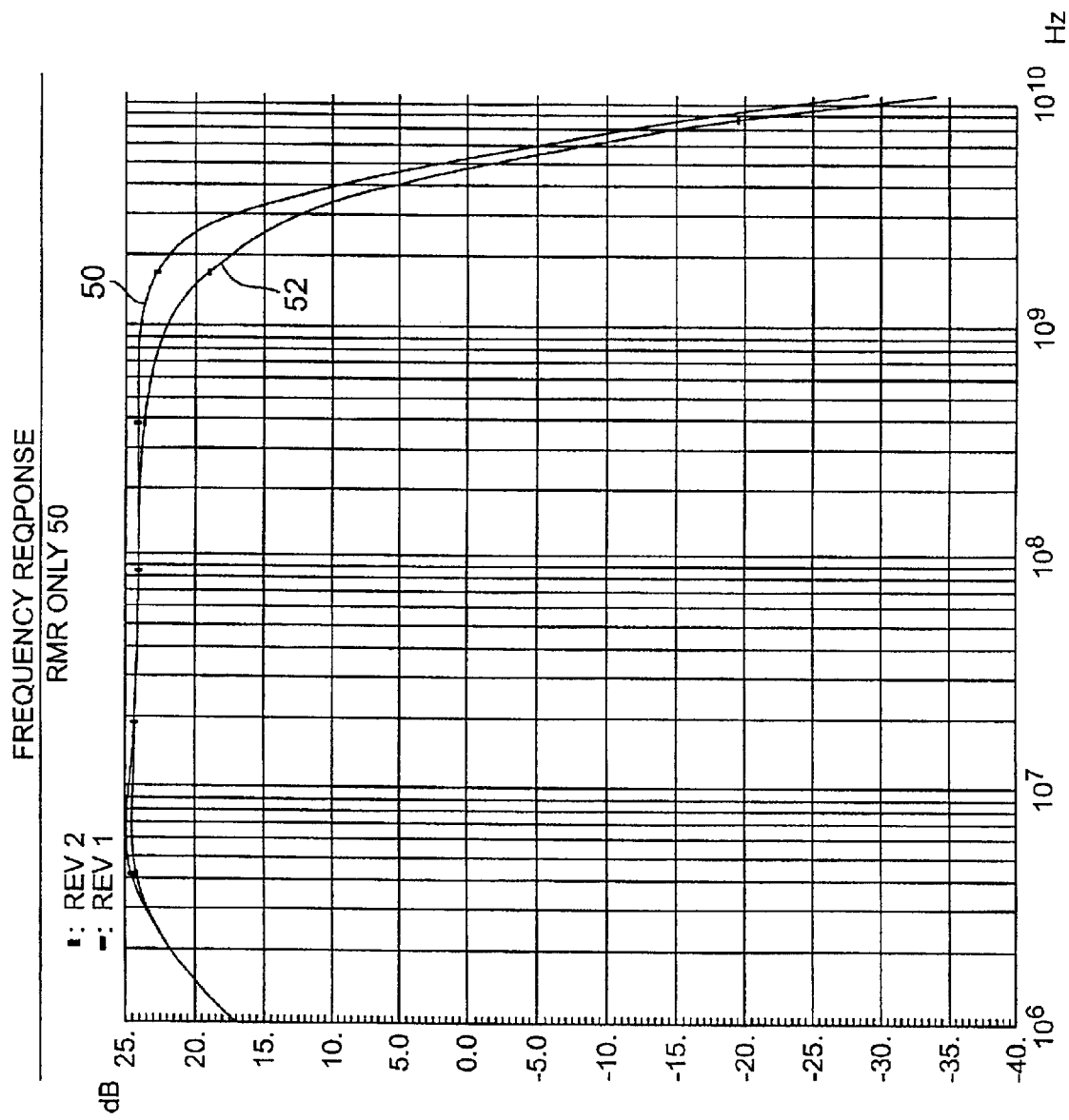
FIG. 5 shows a graph comparing the frequency response of a read system embodying the present invention to the frequency response of a prior art read system.

FIG. 5 shows a graph comparing the frequency response 50 of read system 10 to the frequency response 52 of prior art read system 30. The graph shows the gain (dB) as a function of frequency (Hz). The band of frequencies over which the gain is almost constant, to within a certain number of decibels, is called the bandwidth. The bandwidth of read system 10 extends approximately from $2*10^6$ Hz to $2*10^9$ Hz. The bandwidth of prior art read system 30 extends approximately from $2*10^6$ Hz to $1*10^9$ Hz. Therefore, the bandwidth of read system 10 extends approximately $1*10^9$ Hz further than the bandwidth of prior art read system 30.

Figure 6:
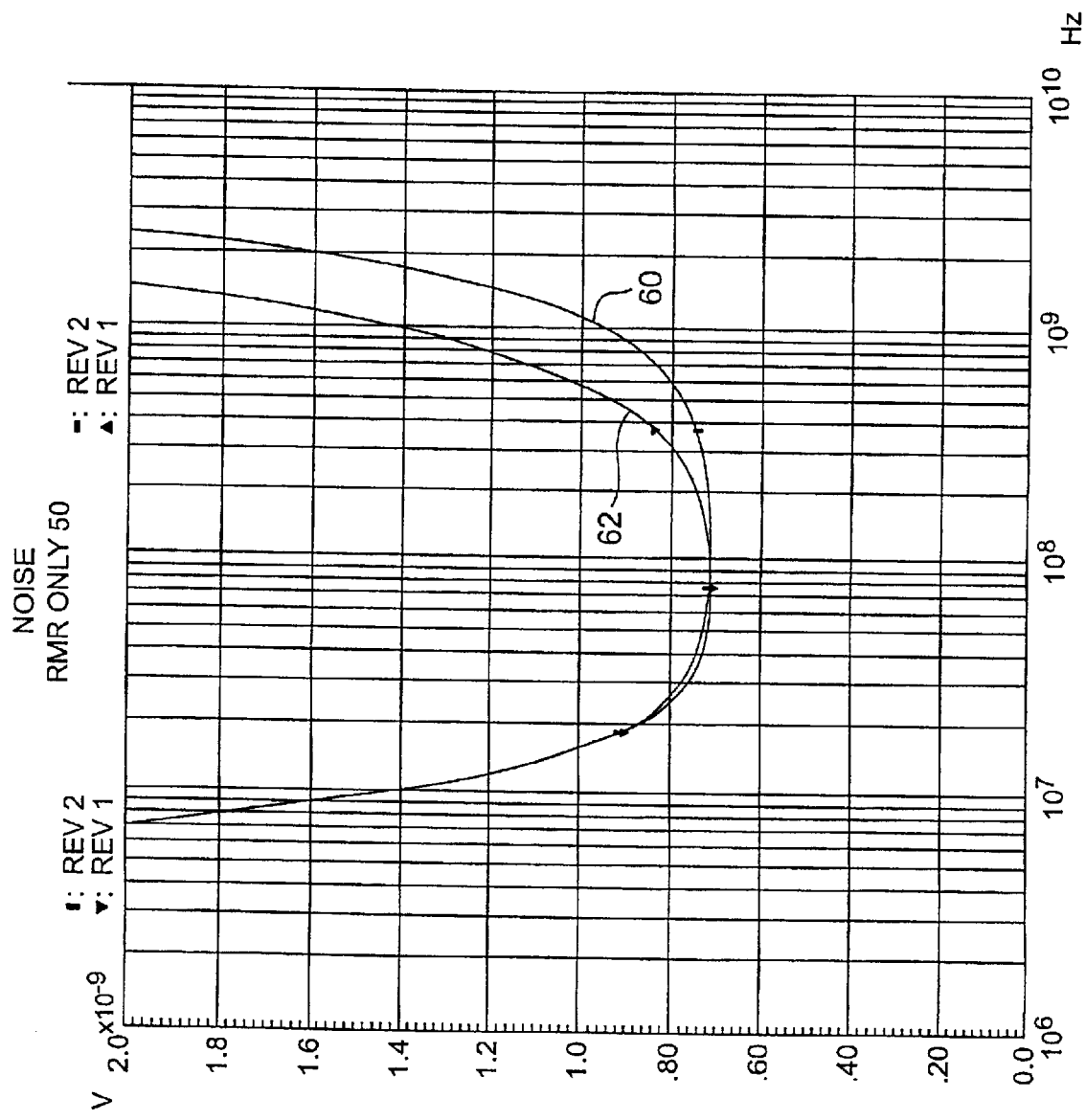
FIG. 6 shows a graph comparing the noise of a read system embodying the present invention to the noise of a prior art read system.

FIG. 6 shows a graph comparing the input referred noise 60 of read system 10 to the input referred noise 62 of prior art read system 30. The graph shows the noise ($10^{-9}$V) as a function of frequency (Hz). The range of frequencies over which read system 10 exhibits noise less than $1.0*10^{-9}$V extends approximately from $1.6*10^7$ Hz to $1.2*10^9$ Hz. The range of frequencies over which prior art read system 30 exhibits noise less than $1.0*10^{-9}$V extends approximately from $1.6*10^7$ Hz to $6*10^8$ Hz. Therefore, the range of frequencies over which read system 10 exhibits less than $1.0*10^{-9}$V of noise extends approximately $4.2*10^8$ Hz further than the range of frequencies over which prior art read system 30 exhibits less than $1.0*10^{-9}$V of noise.

Therefore, the present invention provides a read system having a cross-coupled input stage with improved bandwidth and high frequency noise performance. By implementing coupling circuits with both emitter followers and capacitors, the read system allows a reduced net capacitance between the input signal nodes and the input transistors. The reduced effective input capacitances extend the upper cutoff frequencies of the input transistors, and increase the bandwidth of the read system. This results in reduced high frequency noise, and greater accuracy and capability in detecting data recorded on a magnetic disk with an MR head.

Although the preferred embodiment of the present invention is shown using npn bipolar technology, the present invention may also be practiced using pnp bipolar and FET technologies, the topology for either being readily derived from the small-signal models associated with the npn embodiment. Furthermore, the present invention may be practiced using either discrete or integrated circuit designs. Workers skilled in the art will recognize that changes may be made in form and detail without departing from the spirit and scope of the invention.

What is claimed is:

1. A differential amplifier circuit for amplifying an input signal and for providing an output signal representative of the input signal, the differential amplifier circuit comprising:
   first and second input signal nodes;
   a first amplifier circuit operatively connected to the first input signal node;
   a second amplifier circuit including an input transistor operatively connected to the second input signal node;
   a first coupling circuit including a capacitor and a coupling transistor, the first coupling circuit being connected such that a base of the coupling transistor is connected to the first input signal node and the capacitor is connected between an emitter of the coupling transistor and a base of the input transistor of the second amplifier circuit; and
   a second coupling circuit including a capacitor and a coupling transistor, the second coupling circuit being connected such that a base of the coupling transistor is connected to the second input signal node and the capacitor is connected between an emitter of the coupling transistor and a base of the input transistor of the first amplifier circuit.

2. The differential amplifier circuit of claim 1 wherein the input transistors of the first and second amplifier circuit each have a base, a collector and an emitter, and the first and second amplifier circuits each include:

a collector circuit connected between a fixed potential and the collector of the input transistor; and a current generator for directing current through the input transistor and the collector circuit.

3. The differential amplifier circuit of claim 2 wherein the collector circuit of each of the amplifier circuits includes a cascode stage.

4. The differential amplifier circuit of claim 3 wherein the cascode stage of each of the amplifier circuits comprises:

a cascode transistor having a base, a collector, and an emitter, wherein the base is connected to a bias potential, and the emitter is connected to the collector of the input transistor of the respective amplifier circuit; and a resistor connected between the fixed potential and the collector of the cascode transistor.

5. The differential amplifier circuit of claim 1 wherein each of the first and second coupling circuits further comprises:

a current generator for directing current through a respective coupling transistor.

6. A read system for reading information from a magnetic storage medium using a magnetoresistive head and for providing an output signal representative of the information read, the read system comprising:

first and second input signal nodes for connection to the magnetoresistive head;

a first amplifier circuit including an input transistor operatively connected to the first input signal node;

a second amplifier circuit including an input transistor operatively connected to the second input signal node;

a first coupling circuit including a capacitor and a coupling transistor, the first coupling circuit being connected such that a base of the coupling transistor is connected to the first input signal node and the capacitor is connected between an emitter of the coupling transistor and a base of the input transistor of the second amplifier circuit; and a second coupling circuit including a capacitor and a coupling transistor, the second coupling circuit being connected such that a base of the coupling transistor is connected to the second input signal node and the capacitor is connected between an emitter of the coupling transistor and a base of the input transistor of the first amplifier circuit.

7. The read system of claim 6 wherein the input transistors of the first and second amplifier circuits each have a base, a collector and an emitter, and the first and second amplifier circuits each include:

a collector circuit connected between a fixed potential and the collector of the input transistor; and a current generator for directing current through the input transistor and the collector circuit.

8. The read system of claim 7 wherein the collector circuit of each of the amplifier circuits includes a cascode stage.

9. The read system of claim 8 wherein the cascode stage of each of the amplifier circuits comprises:

a cascode transistor having a base, a collector, and an emitter, wherein the base is connected to a bias potential, and the emitter is connected to the collector of the input transistor of the respective amplifier circuit; and a resistor connected between the fixed potential and the collector of the cascode transistor.

10. The read system of claim 6 wherein each of the first and second coupling circuits further comprises:

a current generator for directing current through a respective coupling transistor.

11. In a read system that includes first and second input signal nodes for connection to a magnetoresistive head, that includes first and second input transistors, and that includes first and second collector circuits connected between a fixed potential and the respective first and second input transistors, the improvement comprising:

a first coupling circuit comprising a first coupling transistor having a base connected to the first input signal node, a collector connected to the fixed potential, and an emitter ac coupled to a base of the second input transistor, and a current generator for directing current through the first coupling transistor; and a second coupling circuit comprising a second coupling transistor having a base connected to the second input signal node, a collector connected to the fixed potential, and an emitter ac coupled to a base of the first input transistor, and a current generator for directing current through the second coupling transistor.

12. The read system of claim 11 wherein a first capacitor is connected between the emitter of the first coupling transistor and the base of the second input transistor, and a second capacitor is connected between the emitter of the second coupling transistor and the base of the first input transistor.

13. A read system for reading information from a magnetic storage medium using a magnetoresistive head and for providing an output signal representative of the information read, the read system comprising:

first and second input signal nodes for connection to the magnetoresistive head;

a first transistor having a base, a collector, and an emitter, wherein the emitter is connected to the first input signal node;

a second transistor having a base, a collector, and an emitter, wherein the emitter is connected to the second input signal node;

a third transistor having a base, a collector, and an emitter, wherein the emitter is connected the collector of the first transistor, and the base is connected to a bias potential;

a fourth transistor having a base, a collector, and an emitter, wherein the emitter is connected the collector of the second transistor, and the base is connected to the bias potential;

a first resistor connected between the collector of the third transistor and a first fixed potential;

a second resistor connected between the collector of the fourth transistor and the first fixed potential;

a first current generator connected between the emitter of the first transistor and a second fixed potential;

a second current generator connected between the emitter of the second transistor and the second fixed potential;

a fifth transistor having a base, a collector, and an emitter, wherein the base is connected to the second input signal node, and the collector is connected to the first fixed potential;

a sixth transistor having a base, a collector, and an emitter, wherein the base is connected to the first input signal node, and the collector is connected to the first fixed potential;

a first capacitor connected between the emitter of the fifth transistor and the base of the first transistor;

a second capacitor connected between the emitter of the sixth transistor and the base of the second transistor;

a third current generator connected between the emitter of the fifth transistor and the second fixed potential; and a fourth current generator connected between the emitter of the sixth transistor and the second fixed potential.

14. A method of amplifying an input signal from a magnetoresistive head, the input signal comprising a differential signal including a first signal provided at a first input signal node and a second signal provided at a second input signal node, the first and second input signal nodes being connected to opposite sides of the magnetoresistive head, the method comprising:

amplifying the first signal with a first amplifier circuit that includes a first input transistor to provide an amplified first signal;

amplifying the second signal with a second amplifier circuit that includes a second input transistor to provide an amplified second signal;

coupling a first capacitor and a first coupling transistor between the first input signal node and a base of the second input transistor such that a base of the first coupling transistor is connected to the first input signal node and the first capacitor is connected between an emitter of the coupling transistor and the base of the second input transistor; and coupling a second capacitor and a second coupling transistor between the second input signal node and a base of the first input transistor such that a base of the second coupling transistor is connected to the second input signal node and the second capacitor is connected between an emitter of the coupling transistor and the base of the first input transistor.

15. The method of claim 14, wherein the step of amplifying the first signal with the first amplifier circuit comprises:

coupling the first input transistor to the first input signal node;

coupling a first cascode transistor to the first input transistor; and coupling a first resistor to the first cascode transistor, the amplified first signal being provided between the first resistor and the first cascode transistor.

16. The method of claim 15, wherein the step of amplifying the second signal with the second amplifier circuit comprises:

coupling the second input transistor to the second input signal node;

coupling a second cascode transistor to the second input transistor; and coupling a second resistor to the second cascode transistor, the amplified second signal being provided between the second resistor and the second cascode transistor.

* * * * *

UNITED STATES PATENT AND TRADEMARK OFFICE
CERTIFICATE OF CORRECTION

PATENT NO.    : 6,831,799 B2
DATED         : December 14, 2004
INVENTOR(S)   : Elango Pakriswamy et al.

It is certified that error appears in the above-identified patent and that said Letters Patent is hereby corrected as shown below:

Column 6,
Line 47, after "circuit", insert -- including an input transistor --
Line 66, delete "circuit", insert -- circuits --

Signed and Sealed this

Thirty-first Day of May, 2005

JON W. DUDAS
*Director of the United States Patent and Trademark Office*